US010313798B2

(12) United States Patent
Venalainen et al.

(10) Patent No.: US 10,313,798 B2
(45) Date of Patent: Jun. 4, 2019

(54) ELECTRONIC DEVICE INCLUDING DIRECTIONAL MEMS MICROPHONE ASSEMBLY

(71) Applicant: Microsoft Technology Licensing, LLC, Redmond, WA (US)

(72) Inventors: Kevin Juho Venalainen, Seattle, WA (US); Brian W. Aznoe, Sherwood, OR (US); Dana William Bourke, Redmond, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 0 days.

(21) Appl. No.: 15/606,424

(22) Filed: May 26, 2017

(65) Prior Publication Data

US 2018/0279056 A1    Sep. 27, 2018

Related U.S. Application Data

(60) Provisional application No. 62/474,557, filed on Mar. 21, 2017.

(51) Int. Cl.
*H04R 3/00*     (2006.01)
*H04R 19/04*    (2006.01)
(Continued)

(52) U.S. Cl.
CPC ............ *H04R 19/04* (2013.01); *B81B 7/0061* (2013.01); *B81C 1/00309* (2013.01); *H04R 1/04* (2013.01);
(Continued)

(58) Field of Classification Search
CPC ........ H04R 19/04; H04R 1/1083; H04R 1/04; H04R 1/326
(Continued)

(56) References Cited

U.S. PATENT DOCUMENTS 5,613,011 A    3/1997 Chase et al.
5,810,420 A    9/1998 Welling
(Continued)

FOREIGN PATENT DOCUMENTS

EP    2552127 A1    1/2013
EP    2822298 A1 *  1/2015    ............... H04R 1/04
(Continued)

OTHER PUBLICATIONS

Feiertag, et al., "Determining the acoustic resistance of small sound holes for MEMS microphones", In Proceedings of Eurosensors XXV, Sep. 4, 2011, pp. 1509-1512.
(Continued)

*Primary Examiner* — Paul Kim
*Assistant Examiner* — Ubachukwu A Odunukwe
(74) *Attorney, Agent, or Firm* — Alleman Hall Creasman & Tuttle LLP

(57)    ABSTRACT

An electronic device with directional MEMS microphone assembly is provided, including a MEMS microphone capsule with a PCB affixed thereto, and a housing affixed to the PCB. The microphone assembly includes a first internal port and a second internal port through the PCB, wherein the first and second internal ports fluidically communicate with the MEMS microphone capsule. The microphone assembly further includes first and second external ports through the housing, wherein the first external port is offset from the first internal port in an offset direction perpendicular to a thickness direction of the microphone assembly. The microphone assembly further includes first and second cavities located between the PCB and the housing, wherein the first cavity fluidically communicates with the first internal port and the first external port, and the second cavity fluidically communicates with the second internal port and the second external port.

18 Claims, 7 Drawing Sheets

(51) Int. Cl.
  *B81B 7/00* (2006.01)
  *B81C 1/00* (2006.01)
  *H04R 1/04* (2006.01)
  *H04R 19/00* (2006.01)
  *H04R 1/38* (2006.01)
  *H04R 1/32* (2006.01)
  *H04R 1/02* (2006.01)

(52) U.S. Cl.
  CPC ............ *H04R 1/38* (2013.01); *H04R 19/005* (2013.01); *B81B 2201/0257* (2013.01); *B81B 2201/058* (2013.01); *B81B 2203/0315* (2013.01); *H04R 1/02* (2013.01); *H04R 1/326* (2013.01); *H04R 2201/003* (2013.01); *H04R 2499/15* (2013.01)

(58) Field of Classification Search
  USPC .......................................... 381/92, 94.1, 355
  See application file for complete search history.

(56) References Cited

U.S. PATENT DOCUMENTS

| | | | |
|---|---|---|---|
| 8,351,634 | B2 | 1/2013 | Khenkin |
| 9,369,788 | B1 | 6/2016 | Ho et al. |
| 2008/0075312 | A1 | 3/2008 | Lan et al. |
| 2009/0161894 | A1 | 6/2009 | Kimura |
| 2010/0128914 | A1* | 5/2010 | Khenkin ............. H04R 19/005 381/361 |
| 2012/0243721 | A1* | 9/2012 | Inoda ................... H04R 3/005 381/365 |
| 2014/0161295 | A1* | 6/2014 | Huang ................. H04R 1/406 381/357 |
| 2014/0353779 | A1 | 12/2014 | Ye |
| 2015/0010191 | A1* | 1/2015 | Baumhauer, Jr. ........ H04R 1/04 381/355 |
| 2015/0023523 | A1 | 1/2015 | Elian et al. |
| 2015/0125022 | A1 | 5/2015 | Jacobs |
| 2018/0041828 | A1* | 2/2018 | Sibbald ............... G10K 11/178 |
| 2018/0070158 | A1* | 3/2018 | Watson ................. H04R 17/02 |
| 2018/0077489 | A1* | 3/2018 | Yang ....................... H04R 1/04 |
| 2018/0091881 | A1* | 3/2018 | Evans ..................... H04R 1/08 |

FOREIGN PATENT DOCUMENTS

| | | |
|---|---|---|
| JP | H06284494 A | 10/1994 |
| JP | 2016105557 A | 6/2016 |
| WO | 2012094722 A1 | 7/2012 |

OTHER PUBLICATIONS

"International Search Report and Written Opinion Issued in PCT Application No. PCT/US18/022280", dated May 23, 2018, 11 Pages.

* cited by examiner

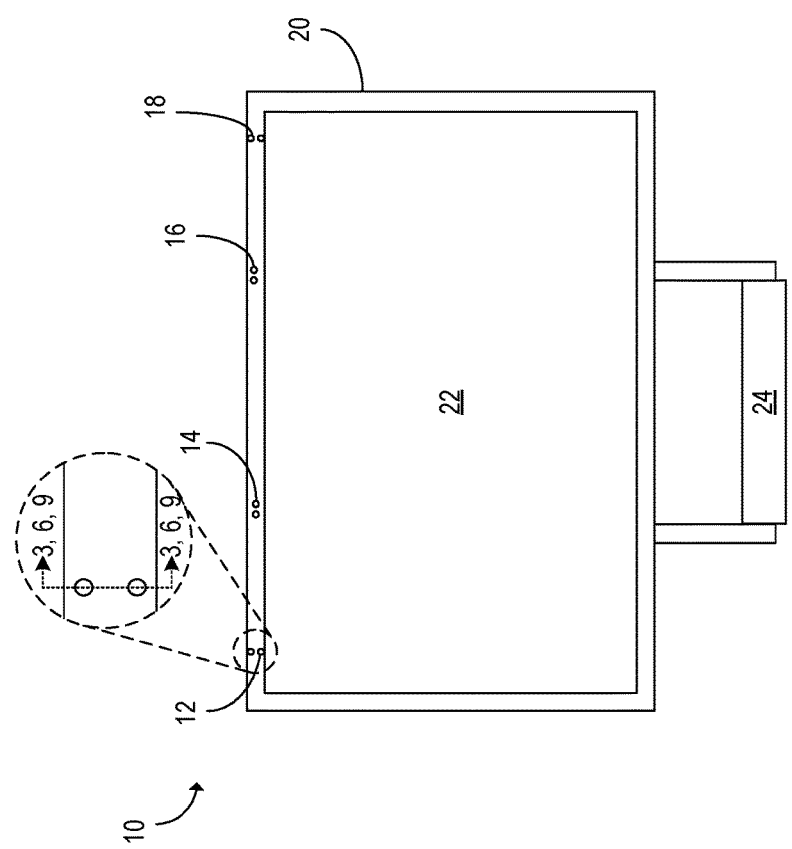

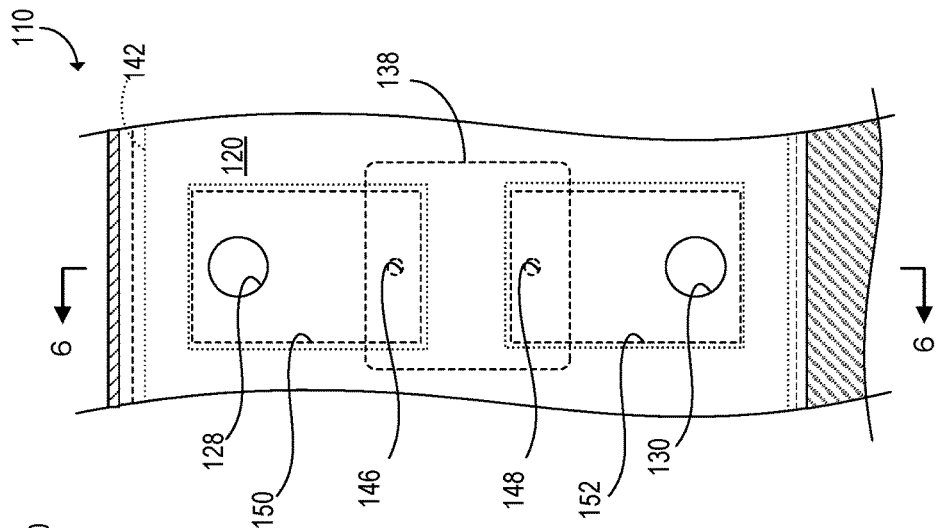
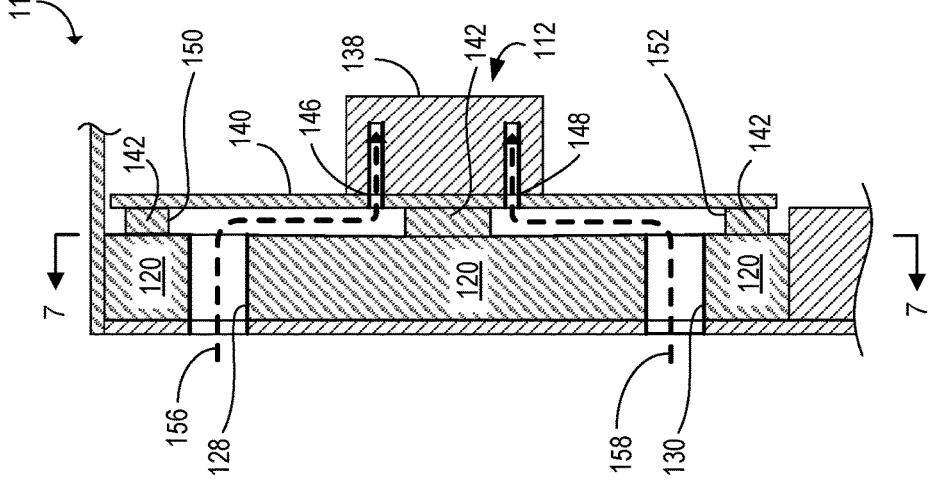
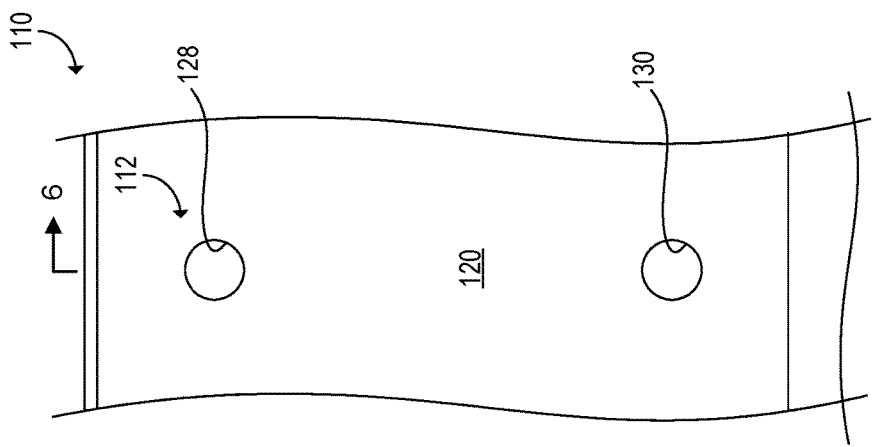

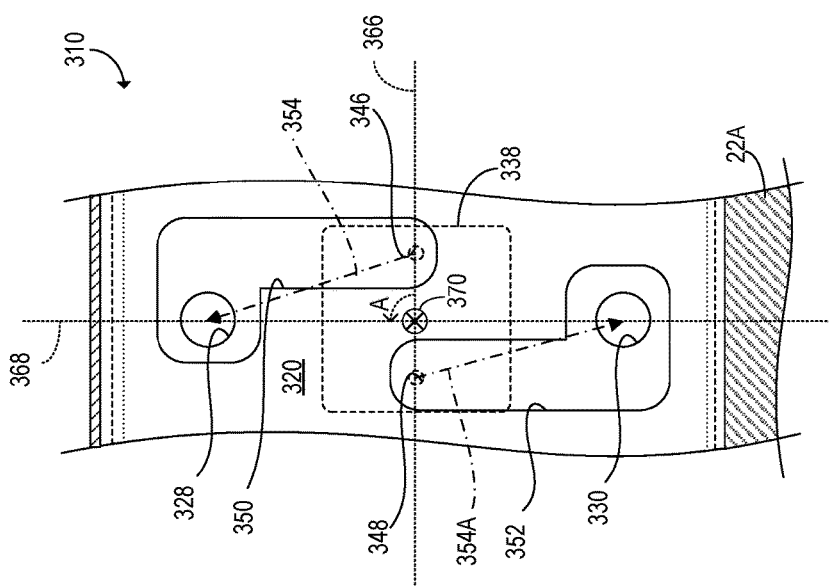

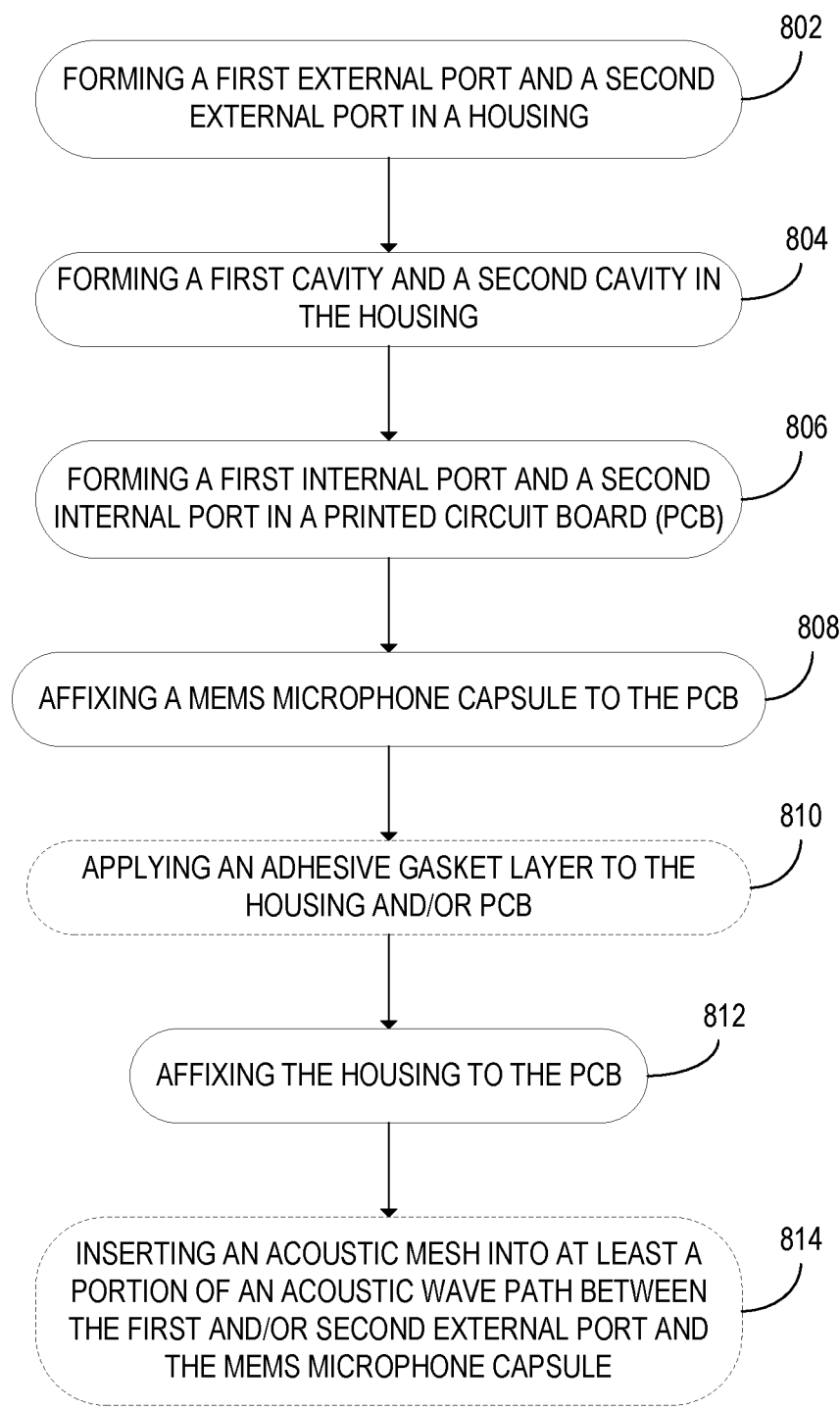

ELECTRONIC DEVICE INCLUDING DIRECTIONAL MEMS MICROPHONE ASSEMBLY

CROSS REFERENCE TO RELATED APPLICATIONS

This application claims priority to U.S. Provisional Patent Application No. 62/474,557 filed Mar. 21, 2017, the entirety of which is hereby incorporated herein by reference.

BACKGROUND

The integration of directional micro-electro-mechanical systems (MEMS) microphones into electronic devices presents several challenges given the ever-shrinking dimensions of electronic products. For example, where MEMS microphones are incorporated into housings of displays, such as in monitors, so-called all-in-one integrated computers, tablets, and smartphones, the thickness of the MEMS assembly directly affects the overall thickness of the display housing. A thicker MEMS assembly, therefore, can lead to a bulkier product, which may be undesirable to consumers, particularly for handheld or portable products.

SUMMARY

A directional micro-electro-mechanical systems (MEMS) microphone assembly that addresses the above challenge is provided. The directional MEMS microphone assembly may include a MEMS microphone capsule, a printed circuit board (PCB) affixed to the MEMS microphone capsule, and a housing affixed to the PCB on a side of the PCB opposite the MEMS microphone capsule. In addition, the directional MEMS microphone assembly may include a first internal port and a second internal port through the PCB, wherein the first internal port and second internal port fluidically communicate with the MEMS microphone capsule. The directional MEMS microphone assembly may further include a first external port and a second external port through the housing, wherein the first external port is offset from the first internal port in an offset direction perpendicular to a thickness direction of the directional MEMS microphone. The directional MEMS microphone assembly may further include a first cavity and a second cavity located between the PCB and the housing, wherein the first cavity fluidically communicates with the first internal port and the first external port, and the second cavity fluidically communicates with the second internal port and the second external port.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF THE DRAWINGS

FIG. 1 is a front view of an electronic device according to one implementation of the present disclosure, including a plurality of directional MEMS microphone assemblies, one of which is shown in an enlarged view.

FIG. 5 is a close-up partial front view of a second embodiment of the electronic device of FIG. 1, in which the first cavity and second cavity of the directional MEMS microphone assemblies are formed by an adhesive gasket layer providing spacing between the housing and the PCB, rather than indentations in the housing.

FIG. 6 is a partial cross-sectional view of the second embodiment of the electronic device of FIG. 1, taken along section 6-6 indicated in FIGS. 1, 5, and 7.

FIG. 7 is a cross-sectional view of the second embodiment of the electronic device of FIG. 1, taken along section 7-7 indicated in FIG. 6.

FIG. 11 is a partial cross-sectional view of a fourth embodiment of the electronic device of FIG. 1 similar to FIG. 10, showing an alternative configuration with L-shaped cavities and in which an external port axis is rotationally offset from an internal port axis.

FIG. 12 is a flowchart of a method of manufacture for an electronic device, according to one embodiment of the present disclosure.

DETAILED DESCRIPTION

Figure 4:
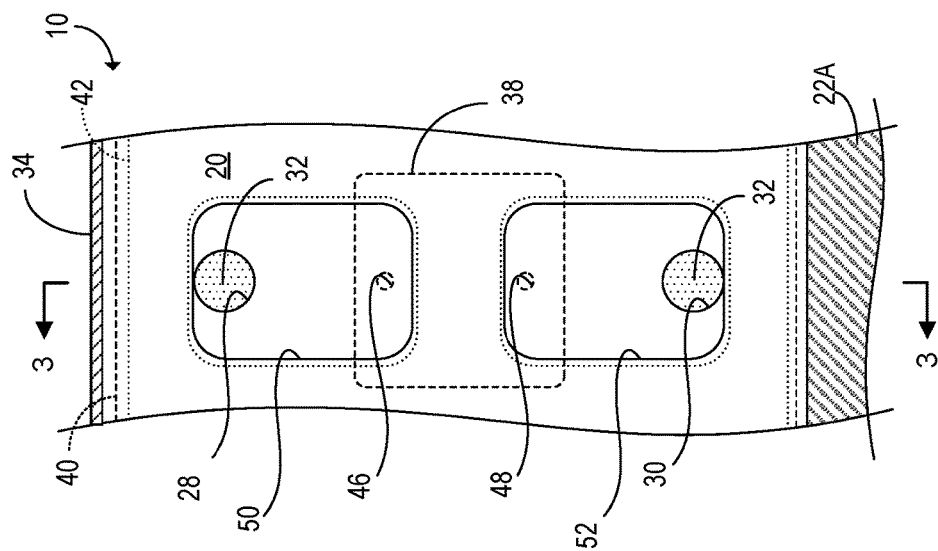
FIG. 4 is a partial cross-sectional view of the first embodiment of the electronic device of FIG. 1, taken along section 4-4 indicated in FIG. 3.

Preliminarily, it is useful to understand the construction of conventional directional MEMS microphones assemblies. Conventional directional MEMS microphones assemblies typically include a MEMS microphone capsule, which has two holes for sensing sound positioned narrowly together, an intermediate plastic chamber, and two widely spaced external ports in a housing of a device, stacked in this order. The plastic chamber includes two acoustical pathways that link the two narrowly spaced holes of the MEMS microphone capsule on an internal side of this stack to the widely spaced external ports in the housing on an external side of this stack. The plastic chamber enables the spacing of the external ports to be placed widely, thereby improving the directional response of the microphone, while enabling the MEMS microphone capsule to have narrowly spaced holes, thereby being compact.

The inventors have recognized drawbacks with this conventional approach. For example, using a plastic chamber in the MEMS microphone assembly increases the thickness of conventional microphone assemblies, which results in a bulkier product. In addition, the plastic chamber must be precisely positioned during manufacturing such that its two external holes are aligned with the ports in the housing, and such that its two internal holes are aligned with the two holes of the MEMS microphone capsule, which can increase manufacturing costs given the high precision of such an alignment.

To address these challenges, the present disclosure provides an electronic device including a directional MEMS microphone assembly that may be compactly formed. Instead of including a plastic chamber intermediate the housing and MEMS microphone capsule as discussed above, the electronic device of the present disclosure is formed without a plastic chamber and includes cavities formed in a housing of the electronic device itself. By eliminating the plastic chamber, a thickness of the MEMS microphone assembly of the electronic device may be desirably decreased. Decreasing the thickness of the MEMS microphone assembly may be particularly useful when the electronic device is space-constrained, such as in thin displays or portable electronic devices, for example. In addition, manufacturing costs may be reduced since precision alignment of the holes in the plastic chamber with holes in the housing and MEMS capsule may be avoided.

FIG. 1 depicts an electronic device 10 including a housing 20 within which is mounted a display 22, and which is supported by a base 24, which may contain a processor, non-volatile memory, and volatile memory of the electronic device 10, in one example configuration. It will be appreciated that housing 20 in this example is a bezel of the display 22. In other examples, the housing 20 may be a different housing component, such as a housing of base 24 which encloses a processor, a housing of a laptop, smartphone, tablet computing device, head mounted display device, smartwatch, etc.

Within the housing 20, a plurality of directional MEMS microphone assemblies 12, 14, 16, and 18 are provided. The MEMS microphone assemblies together form a microphone array. It will be appreciated that while multiple MEMS microphone assemblies are illustrated in this example, in other examples only a single MEMS microphone assembly may be provided. Each of the directional MEMS microphone assemblies 12, 14, 16, and 18 is associated with a corresponding pair of external ports in the housing 20, which form acoustic wave paths between the directional MEMS microphones 12, 14, 16, and 18 and the exterior of the housing 20. Individual members of the array may have different directionality axes, along which its pair of external ports are formed. In the illustrated configuration, MEMS microphone assemblies 12 and 18 have a vertical axis of directionality, while MEMS microphone assemblies 14 and 16 have a horizontal axis of directionality. Although the illustrated microphone assemblies have response axes within the plane of the display 22 of the electronic device 10, it will be understood that the microphone response axes may be in other orientations such as towards the user. One such embodiment may be in the direction perpendicular to the display 22, corresponding to out of the page towards the reader in FIG. 1. While the microphone assemblies are depicted adjacent to the display 22 with exterior ports on the front of the electronic device 10, in an embodiment the exterior ports may be on other device surfaces such as the top bezel facing upwards. The directional MEMS microphone assemblies 12, 14, 16, 18 may take several forms, examples of which are shown in FIGS. 2-11.

Figure 3:
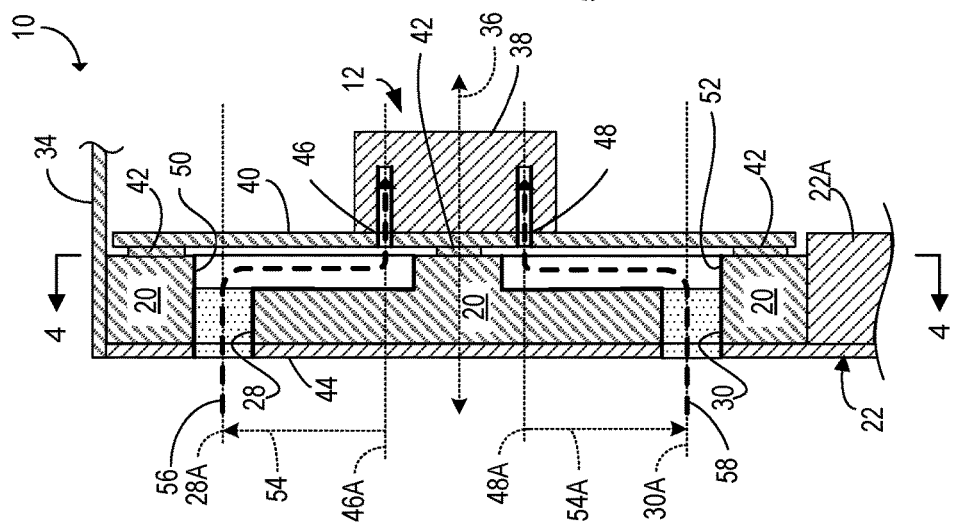
FIG. 3 is a partial cross-sectional view of one of the MEMS microphone assemblies of the first embodiment of the electronic device of FIG. 1, taken along section 3-3 indicated in FIGS. 1, 2, and 4, illustrating first and second cavities that are formed as indentations within a housing of the electronic device.
Figure 2:
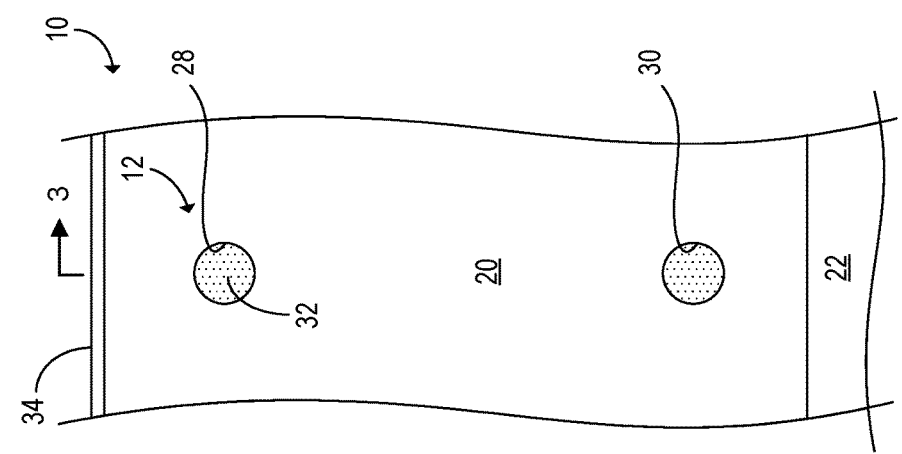
FIG. 2 is a close-up partial front view of a first embodiment the electronic device of FIG. 1, showing one of the directional MEMS microphone assemblies.

FIGS. 2-4 depict a first embodiment of a MEMS microphone assembly 12 of the electronic device 10 of FIG. 1. FIG. 2 shows a partial close-up front view of a region of the electronic device 10 of FIG. 1, as seen from the exterior of the housing 20. The electronic device 10 includes a first exterior port 28 and a second exterior port 30 through the housing 20. Although various dimensions are possible, the first and second external ports 28 and 30 may be separated by a distance of 10 to 12 millimeters, in one particular example. The electronic device 10 further includes an acoustic mesh 32 provided along the acoustic wave path from the exterior of the electronic device to the MEMS microphone. In the embodiment of FIG. 2, the acoustic mesh 32 is located in the first exterior port 28 and second external port 30, as illustrated by shading in FIGS. 2-4. The electronic device 10 further includes a frame 34 located at an edge of the electronic device 10.

FIG. 3 depicts a partial cross-sectional view of the electronic device 10 taken along section 3-3 indicated in FIGS. 1, 2, and 4. This cross-sectional view illustrates a thickness direction 36 of the MEMS microphone assembly 12. As shown, the MEMS microphone assembly 12 includes a MEMS microphone capsule 38, which in this embodiment is positioned on an innermost side of the MEMS microphone assembly 12. The MEMS microphone assembly 12 further includes a printed circuit board (PCB) 40 affixed to the MEMS microphone capsule 38. The PCB 40 may be a rigid PCB, a flexible PCB, or some other type of PCB. The housing 20 is affixed to the PCB 40 on a side of the PCB 40 opposite the MEMS microphone capsule 38. The housing 20 is affixed to the PCB 40 by an adhesive gasket layer 42 between the PCB 20 and the housing 20.

The electronic device 10 further includes a covering 44 on a side of the housing 20 opposite the PCB 40, and a frame 36 located at an outer perimeter edge of the electronic device. The covering 44 may be, for example, a glass layer that covers both the display 22 and the housing 20. The display 22 is formed by the covering 44 and a display stack 22A positioned thereunder. The display stack 22A may be a liquid crystal display (LCD) stack, an organic light emitting diode display stack (OLED), or other type of display stack.

Although a variety of dimensions are possible, the PCB 40 and housing 20 may have a combined thickness between 1.8 and 2.4 millimeters, in one particular example. The distance from an outer surface of the housing 20 to an interior surface (i.e., the innermost surface) of the MEMS microphone capsule 38 may be between 2.9 and 3.8 millimeters in the thickness direction 36, not inclusive of the thickness of covering layer 44. In contrast, in conventional electronic devices that include plastic chambers affixed to directional MEMS microphone capsules, a typical distance from an external surface of the housing 20 to an internal surface of the MEMS microphone capsule is between 4.5 and 5.5 millimeters. This illustrates one potential advantage of the subject configuration, namely, the reduced overall thickness of the MEMS microphone assembly 12.

The electronic device 10 further includes a first internal port 46 and a second internal port 48 through the PCB 40. The first internal port 46 and second internal port 48 fluidically communicate with the MEMS microphone capsule 38. In other words, a path along which a fluid (typically air) may flow is formed by the first internal port 46, the second internal port 48, and the MEMS microphone capsule 38. When an adhesive gasket layer 42 is present, as illustrated in this embodiment, the first internal port 46 and second internal port 48 may pass through the adhesive gasket layer 42. In the illustrated configuration the within the adhesive gasket layer 42 three strips of adhesive are provided, two along the edges of the MEMS microphone assembly 12 (top and bottom strips in FIG. 3) forming a fluidic boundary at outer edges of the first and second cavities 50, 52 and between a portion of the housing 20 and a portion of the PCB 40, and one in the middle, forming a fluidic boundary intermediate the first and second cavities 50 and 52 and between middle portions of the PCB 40 and housing 20. Alternatively, the entire inner surface of housing 20 may be covered by the adhesive layer 42.

As viewed from the side in FIG. 2, the first external port 28 and a second external port 30 extend through the housing 20, and also through covering 44, along respective external port axes 28A, 30A. The external port axis 28A of the first external port 28 is offset from the internal port axis 46A of the first internal port 46 in a first offset direction 54 that is perpendicular to a thickness direction 36 of the directional MEMS microphone 12. Likewise, the external port axis 30A of the second external port 30 may be offset from the internal port axis 48A of the second internal port 48 in a second offset direction 54A that is perpendicular to the thickness direction 36, and opposite of the first offset direction 54 of the first external port 28. Although both the first and second external ports 28, 30 are shown as offset from their corresponding internal ports 46, 48 in this embodiment, it will be appreciated that alternatively only one of the two external ports 28, 30 could be offset in this manner. As mentioned above, the axes 28A, 30A of the first and second external ports 28, 30 may be separated by a distance of 10 to 12 millimeters, in one example. This separation allows for the directional MEMS microphone 12 to have sufficient directional response. It should be noted that first and second external ports 28, 30 and first and second internal ports 46, 48 are typically formed by drilling or milling with a round bit and have circular cross sections as viewed in FIGS. 2 and 4, and thus the axes 28A, 30A, 46A, 48A are formed centrally within the circular cross-sectional area of each respective port.

As briefly mentioned above, the electronic device 10 includes a first cavity 50 and a second cavity 52 located between the PCB 40 and the housing 20. In this first embodiment, the first cavity 50 and the second cavity 52 are indentations in the housing 20, i.e., are concavities formed in the generally planar inner surface of housing 20. The first cavity 50 fluidically communicates with the first internal port 46 and the first external port 28, and the second cavity 52 fluidically communicates with the second internal port 48 and the second external port 30. The first external port 28, the first cavity 50, and the first internal port 46 form a first acoustic wave path 56 from outside the electronic device 10 to the MEMS microphone capsule 38. Similarly, the second external port 30, the second cavity 52, and the second internal port 48 form a second acoustic wave path 58 from outside the electronic device 10 to the MEMS microphone capsule 36. These acoustic wave paths are illustrated in bold dashed lines.

FIG. 4 is a partial cutaway view of the electronic device 10, taken along the section indicated at 4-4 in FIG. 3. In this view, elements that are visible are shown in solid line and cross section, while elements that overlay this view (i.e., are positioned above the page) are shown in dashed lines. This view illustrates the perimeters of the first cavity 50 and second cavity 52 formed in the inner surface of housing 20. These cavities 50, 52 respectively overlap in this view the first external port 28 and second external port 30. Further a perimeter of the directional MEMS microphone capsule 38 is shown to overlap in this view each of the first and second cavities 50, 52, and the internal ports 46, 48 of the capsule are shown to be positioned over the first and second cavities 50, 52, respectively.

In FIG. 4, the acoustic meshes 32 are visible within the external ports 28 and 30. The acoustic meshes 32, it will be appreciated, are located along at least a portion of an acoustic wave path from outside the electronic device 10 to the directional MEMS microphone 12. In the embodiment shown in FIG. 4, the acoustic meshes 32 are located in the first external port 28 and the second external port 30. The acoustic wave path in which the acoustic mesh 32 is located may be the first acoustic wave path 56, the second acoustic wave path 58, or both, as in the illustrated embodiment, and may be in any of the acoustic wave paths of the various embodiments described herein. For example, the location of acoustic mesh 32 may be one or more of the following in alternative locations: in the first external port 28, the second external port 30, the first cavity 50, the second cavity 52, the first internal port 46, and/or the second internal port 48. Use of the acoustic mesh 32 in these locations may protect the MEMS capsule 38 of the directional MEMS microphone assembly 12 from damage due to dust, moisture, or other potential sources of damage that might otherwise enter the acoustic wave paths 56, 58. By way of example, the acoustic mesh 32 may be composed of a synthetic or organic material, such as cotton, plastic, or other material.

A second embodiment of the electronic device of FIG. 1 is depicted in FIGS. 5-7, and indicated at 110. In FIGS. 5-7, similar parts to the first embodiment of FIGS. 2-6 share similar numbers, and description thereof is omitted except where different for the sake of brevity. As in FIG. 2, FIG. 5 shows a close-up partial front view of a region of the electronic device 110 containing the external ports 128, 130 of the MEMS microphone assembly 112. In FIG. 5, neither the first acoustic wave path 156, nor the second acoustic wave path 158 includes any acoustic mesh positioned thereon.

FIG. 6 shows a cross-sectional view of the second embodiment of electronic device 110, taken along section 6-6 indicated in FIGS. 1, 5, and 7. As is most evident in FIG. 6, the second embodiment illustrated in FIGS. 5-7 is similar to that of the first embodiment of FIGS. 2-4, except that in the second embodiment, the first cavity 150 and the second cavity 152 are not indentations (i.e., not concavities) in the inner surface of housing 120. Instead, a thick adhesive gasket layer 142 is used, which provides a sufficiently large separation between the inner surface of the housing 120 and the PCB 140 to form the first cavity 150 and the second cavity 152. The inner surface of the housing 120 is flat and substantially planar. The first external port 128, the first cavity 150, and the first internal port 146 form the first acoustic wave path 156 from outside the electronic device 110 to the MEMS microphone capsule 138, and the second external port 130, the second cavity 152, and the second internal port 148 form a second acoustic wave path 158 from outside the electronic device 110 to the MEMS microphone capsule 138.

FIG. 7 shows a cross-sectional view of the second embodiment of the electronic device 110 taken along section 7-7 indicated in FIG. 6. The primary difference between the first and second embodiments noticeable in this view is that the first and second cavities 150, 152 are not indented into the housing 120, and thus are shown in dashed lines in this view, indicating the cavities overlay the inner surface of housing 120 in this view, rather than form concavities in the inner surface as in the first embodiment.

Figure 10:
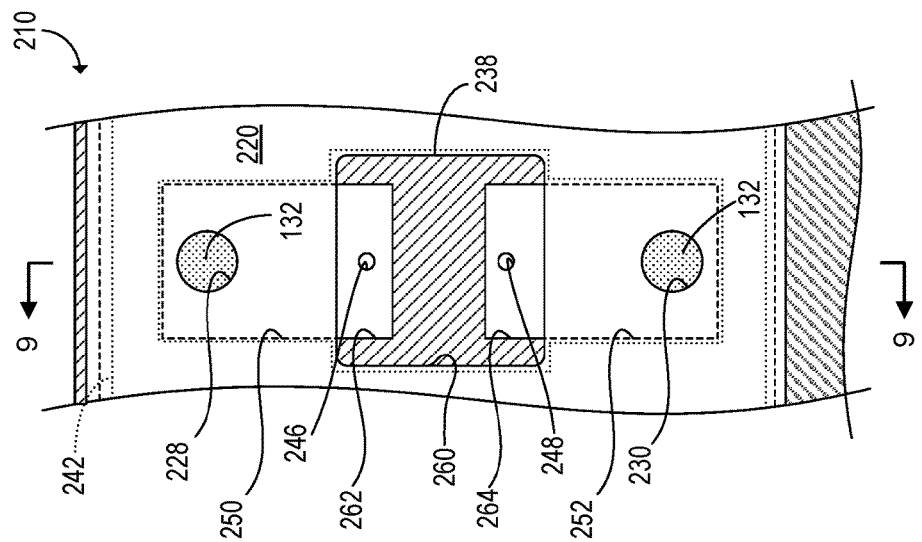
FIG. 10 is a partial cross-sectional view of the third embodiment of the electronic device of FIG. 1, taken along the section 10-10 shown in FIG. 9.
Figure 9:
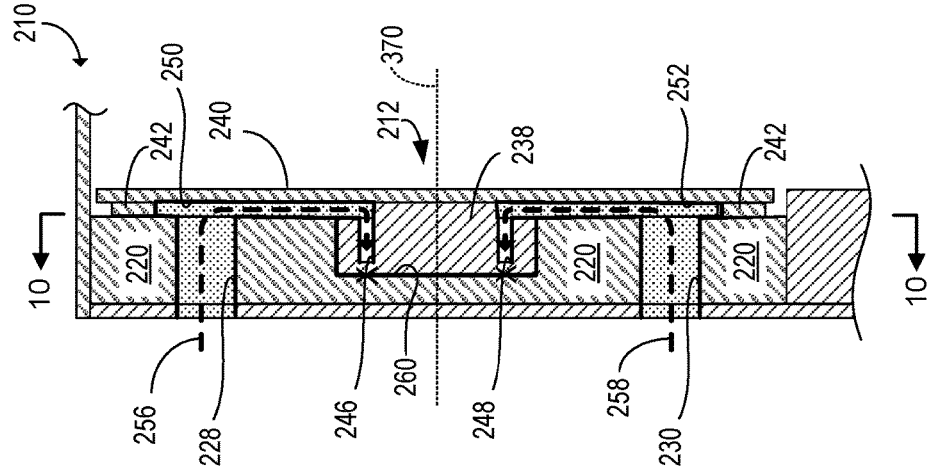
FIG. 9 is a partial cross-sectional view of the third embodiment of the electronic device of FIG. 1, taken along section 9-9 indicated in FIGS. 1, 8, and 10.
Figure 8:
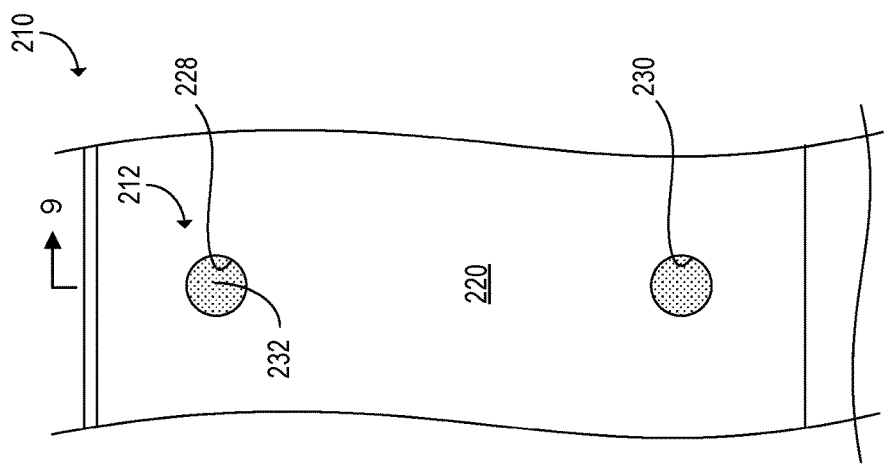
FIG. 8 is a close-up partial view of the electronic device of FIG. 1, according to a third embodiment of the present disclosure in which the housing is affixed to the PCB on a side of the PCB adjacent to the MEMS microphone capsule.

A third embodiment of the electronic device is shown at 210 in FIGS. 8-10. In FIGS. 8-10, similar parts to the first and second embodiments of FIGS. 2-7 share similar numbers, and description thereof is omitted except where different for the sake of brevity. FIG. 8 shows a close-up view of a region of the electronic device 210 including a MEMS microphone assembly 212, according to this embodiment. As in FIGS. 2 and 5, FIG. 8 shows a first external port 228 and a second external port 230 of directional MEMS microphone assembly 212 in the housing 220 of the electronic device 210. The directional MEMS microphone assembly 212 of this embodiment is a side-ported directional MEMS microphone assembly.

FIG. 9 shows a cross-sectional view of the electronic device 210 of the third embodiment, taken along section 9-9 indicated in FIGS. 1, 8, and 10. In this embodiment, the directional MEMS microphone 212 includes a MEMS microphone capsule 238 positioned in between the housing 220 and the PCB 240. The MEMS microphone capsule 238 is affixed to the PCB 240, and the PCB 240 is affixed to the housing 220, so the side from which the MEMS microphone capsule 238 protrudes faces the housing 220. Peripheral regions of the PCB 240 are affixed to the housing 220 via adhesive gasket layer 242, and the protruding MEMS microphone capsule 238 is at least partially accommodated in a third cavity 260 formed in the flat inner surface of the housing 220. The third cavity 260 typically is formed to be intermediate the first cavity 250 and second cavity 252, i.e., vertically intermediate as viewed in FIG. 9. The third cavity 626 is sized to accommodate at least a portion of the MEMS microphone capsule 238 that protrudes toward the housing 20 from the PCB 240. In the third embodiment, the adhesive gasket layer 242 both joins and provides separation between the flat surface of the housing 220 and the PCB 240, sufficient to provide space for the first cavity 250 and the second cavity 252. Thus, the PCB 240 is affixed to the housing 20 at a location surrounding a rim or lip of the third cavity 260 by the adhesive gasket layer. It will be appreciated that the third cavity 260 fluidically communicates with the first cavity 250 and the second cavity 252.

Although a side ported MEMS microphone assembly is shown in FIG. 9, in an alternative arrangement, a front-ported directional MEMS microphone assembly may be used in the configuration of FIG. 9, having ports opening on the front side of the MEMS microphone assembly (left side in FIG. 9) in the locations indicated by X, rather than on the sides as illustrated. Such a front ported directional MEMS microphone assembly may be inserted into the third cavity 260, and the first and second acoustic wavepaths 256, 258 may be formed to fluidically communicate with the ports at the locations indicated by X on the front side of the MEMS microphone assembly, in this alternative configuration.

FIG. 10 illustrates that openings 262, 264 are provided in the sides of the base of the MEMS microphone capsule 238 to enable fluidic communication between the first and second cavities 250, 252 and the first and second internal ports 246, 248. Thus, a first acoustic wave path 256 is formed from an outside of the electronic device 210 to the MEMS microphone capsule 238, including the first external port 228, the first cavity 250, the first opening 262, and the first internal port 246. A second acoustic wave path 258 is formed from the outside of the electronic device 210 to the MEMS microphone capsule 238, including the second external port 230, the second cavity 252, the second opening 264, and the second internal port 248. It will be noted that FIG. 9 shows the acoustic mesh 132 positioned both in the first and second external ports 228, 230 and in the first and second cavities 250, 252. The first acoustic path is separated from the second acoustic path by a portion of the MEMS microphone capsule 238.

FIG. 10 shows a cross-sectional view of the electronic device 10, taken from the section 10-10 indicated in FIG. 9. As illustrated in FIG. 10, the first cavity 250 overlaps the first external port 228, the opening 262, a portion of the third cavity 260 corresponding to the opening 262, and the first internal port 246 in this view, enabling fluidic communication therebetween. Likewise, the second cavity 252 overlaps the second external port 230, the opening 264, a portion of the third cavity 260 corresponding to the opening 264, and the second internal port 248 in this view, enabling fluidic communication therebetween.

A cross-sectional view of a fourth embodiment of the present disclosure is depicted in FIG. 11. The fourth embodiment is similar to the first through third embodiments, and will not be re-described except where different for the sake of brevity. FIG. 11 shows an electronic device 310, similar to electronic device 10 of FIG. 1. In the fourth embodiment, the shape of the first and second cavities is different than in prior embodiments, as described below. A first external port 328 fluidically communicates with the first L-shaped cavity 350, and a second external port 330 fluidically communicates with the second L-shaped cavity 352. A first internal port 346 fluidically communicates with the first L-shaped cavity 350, and a second internal port 348 fluidically communicates with the second cavity 352. The first internal port 346 and second internal port 348 fluidically communicate with the MEMS microphone capsule 338.

The first and second internal ports 346 and 348 are aligned along an internal port axis 366. The first and second external ports 328 and 330 are aligned along an external port axis 368. The external port axis 368 is rotationally offset by an angle A from the internal port axis 366 in the plane of the cross section. While angle A is illustrated as 90 degrees, it will be appreciated that angle A may have any value greater than 0 degrees and less than 180 degrees. This rotational offset rotates the primary response axis of the directional MEMS microphone so that it is aligned with the external port axis 368 instead of the internal port axis 366.

In the embodiment shown in FIG. 11, each of the first cavity 350 and the second cavity 352 has an "L" shape. The first and second external ports 328, 330 are offset from the first and second internal ports 346, 348 along the housing 320 in respective and opposite first and second offset directions 354, 354A perpendicular to a thickness direction 370 (into the page in this figure) (see FIG. 9), i.e., in the plane of the axes 366 and 368. This L-shaped configuration of the first and second cavities 350, 352 may be applied to any of the first through third embodiments.

FIG. 12 depicts a flowchart of a method 800 for manufacturing an electronic device including a directional MEMS microphone. At step 802, the method includes forming a first external port and a second external port in a housing. Although a variety of dimensions are possible, the first and second external ports may be separated by a distance of 10 to 12 millimeters, central axis to central axis, in one example. At step 804, the method includes forming a first cavity and a second cavity in the housing. The first cavity fluidically communicates with the first external port and the second cavity fluidically communicates with the second external port. In some embodiments, the first external port, second external port, first cavity, and second cavity may be formed by routing, although other suitable manufacturing processes may be utilized.

At step 806, the method includes forming a first internal port and a second internal port in a PCB. The first internal port and second internal port may be formed by routing. At step 808, the method includes affixing a MEMS microphone capsule to the PCB. The MEMS microphone capsule may be affixed to the PCB such that the first internal port and second internal port fluidically communicate with the MEMS microphone capsule. At step 810, the method may include applying an adhesive gasket layer to the housing and/or PCB.

At step 812, the method includes affixing the housing to the PCB. The housing is affixed to the PCB such that the first internal port fluidically communicates with the first cavity and the second internal port fluidically communicates with the second cavity. In addition, the first external port is offset from the first internal port in an offset direction perpendicular to a thickness direction of the directional MEMS microphone. The second external port may also be offset from the second internal port in a vertical direction perpendicular to the thickness direction of the directional MEMS microphone. The housing may be affixed to the PCB such that the first and second internal ports are aligned along an internal port axis. The first and second external ports may be aligned along an external port axis, wherein the external port axis is rotationally offset from the internal port axis.

Although a variety of dimensions are possible, in some embodiments, the PCB and housing may have a combined thickness between 1.8 and 2.4 millimeters. In addition, the distance from an external surface of the housing to an interior surface of the MEMS microphone capsule may be between 2.9 and 3.8 millimeters.

At step 814, the method may include inserting an acoustic mesh into at least a portion of an acoustic wave path between the first and/or second external port and the MEMS microphone capsule. The acoustic mesh may have a location selected from the group consisting of the first external port, the second external port, the first cavity, the second cavity, the first internal port, and the second internal port. Step 814 may be performed after any of the steps in the flowchart of the method 800, not exclusively after step 812. When step 814 is performed before step 812, the acoustic wave path between the first and/or second external port and the MEMS microphone capsule may be formed while the acoustic mesh is already in place, rather than inserting the acoustic mesh into a portion of the acoustic wave path.

In some embodiments, the methods and processes described herein may be tied to a computing system of one or more computing devices. In particular, such methods and processes may be implemented as a computer-application program or service, an application-programming interface (API), a library, and/or other computer-program product.

Figure 13:
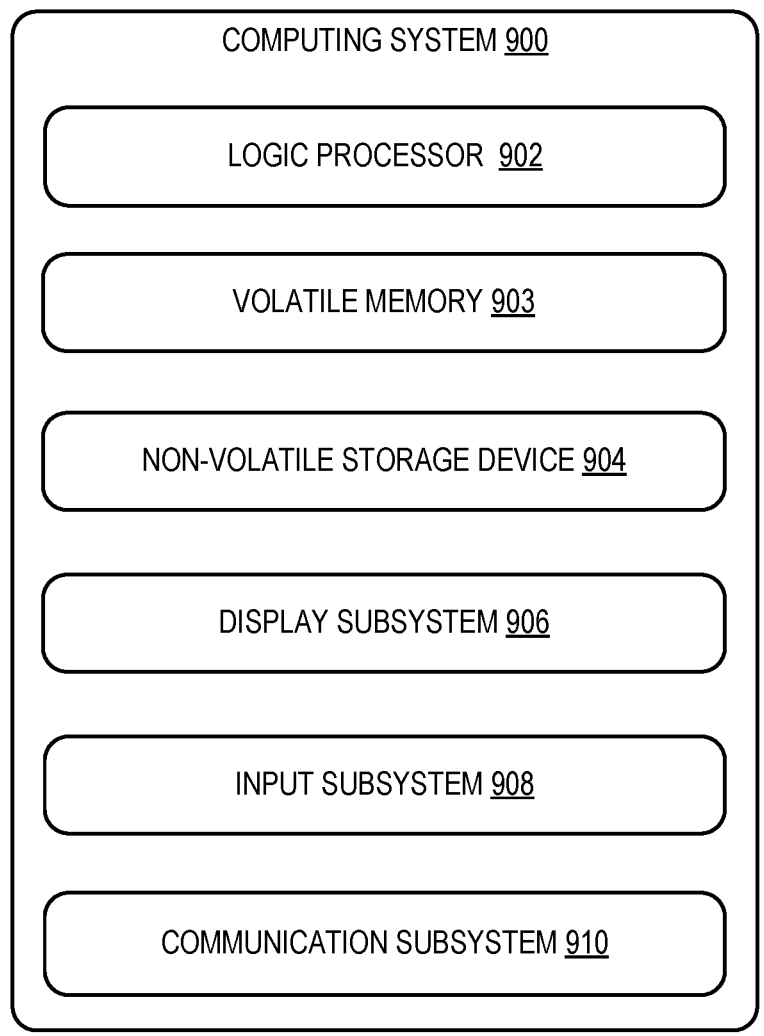
FIG. 13 is a schematic representation of a computing device, according to one embodiment of the present disclosure.

FIG. 13 schematically shows a non-limiting embodiment of a computing system 900 that can be utilized as the computing device of FIG. 1, and may be used to enact one or more of the methods and processes described above. Computing system 900 may take the form of one or more personal computers, server computers, tablet computers, home-entertainment computers, network computing devices, gaming devices, mobile computing devices, mobile communication devices (e.g., smart phone), and/or other computing devices, and wearable computing devices such as smart wristwatches and head mounted augmented reality devices.

Computing system 900 includes a logic processor 902, volatile memory 903, and a non-volatile storage device 904, such as a hard drive or FLASH memory drive. Computing system 900 may optionally include a display subsystem 906, input subsystem 908 including a touch panel, keyboard, mouse, or microphone as appropriate, and a communication subsystem 910 configured for wired or wireless communication with external computing devices and peripherals. It will be appreciated that the directional MEMS microphone assemblies described above may be input subsystem 908, and may provide input to software programs stored in non-volatile storage device 904 and executed by processor 902 using portions of volatile memory 903.

According to one aspect of the present disclosure, an electronic device is provided, comprising a directional micro-electro-mechanical systems (MEMS) microphone assembly. The directional MEMS microphone assembly may include a MEMS microphone capsule, a printed circuit board (PCB) affixed to the MEMS microphone capsule, and a housing affixed to the PCB on a side of the PCB opposite the MEMS microphone capsule. The directional MEMS microphone assembly may further include a first internal port and a second internal port through the PCB, wherein the first internal port and second internal port fluidically communicate with the MEMS microphone capsule. The directional MEMS microphone may further include a first external port and a second external port through the housing, wherein the first external port is offset from the first internal port in an offset direction perpendicular to a thickness direction of the directional MEMS microphone. The directional MEMS microphone assembly may further include a first cavity and a second cavity located between the PCB and the housing, wherein the first cavity fluidically communicates with the first internal port and the first external port, and the second cavity fluidically communicates with the second internal port and the second external port.

According to this aspect, the offset direction may be a first offset direction, and the second external port may be offset from the second internal port in a second offset direction that is perpendicular to the thickness direction.

According to this aspect, the electronic device may further comprise an adhesive gasket layer between the PCB and the housing.

According to this aspect, the electronic device may further comprise an acoustic mesh located along at least a portion of an acoustic wave path from outside the electronic device to the directional MEMS microphone. According to this aspect, the acoustic mesh may be positioned in a location selected from the group consisting of the first external port, the second external port, the first cavity, the second cavity, the first internal port, and the second internal port.

According to this aspect, the first and second external ports may be separated by a distance of 10 to 12 millimeters.

According to this aspect, the first and second internal ports may be aligned along an internal port axis and the first and second external ports may be aligned along an external port axis, wherein the external port axis is rotationally offset from the internal port axis. According to this aspect, each of the first cavity and the second cavity may be L-shaped, and the first and second external ports may be offset from the first and second internal ports along the housing in respective opposite directions perpendicular to the thickness direction.

According to this aspect, the PCB and housing may have a combined thickness between 1.8 and 2.4 millimeters, and a distance from an external surface of the housing to an interior surface of the MEMS microphone capsule may be between 2.9 and 3.8 millimeters.

According to another aspect of the present disclosure, a method for manufacturing an electronic device including a directional micro-electro-mechanical systems (MEMS)

microphone assembly is provided. The method may comprise forming a first external port and a second external port in a housing. The method may further include forming a first cavity and a second cavity in the housing, wherein the first cavity fluidically communicates with the first external port and the second cavity fluidically communicates with the second external port. The method may further include forming a first internal port and a second internal port in a printed circuit board (PCB). The method may further include affixing a MEMS microphone capsule to the PCB such that the first internal port and second internal port fluidically communicate with the MEMS microphone capsule. The method may further include affixing the housing to the PCB such that the first internal port fluidically communicates with the first cavity, the second internal port fluidically communicates with the second cavity, and the first external port is offset from the first internal port in an offset direction perpendicular to a thickness direction of the directional MEMS microphone.

According to this aspect, the offset direction may be a first offset direction, and the second external port may be offset from the second internal port in a second offset direction perpendicular to the thickness direction of the directional MEMS microphone assembly.

According to this aspect, the first external port, second external port, first cavity, and second cavity may be formed by routing.

According to this aspect, the method may further comprise applying an adhesive gasket layer to the housing and/or PCB, to thereby join the housing to the PCB.

According to this aspect, the method may further comprise inserting an acoustic mesh into at least a portion of an acoustic wave path between the first and/or second external port and the MEMS microphone capsule.

According to this aspect, the first and second external ports may be separated by a distance of 10 to 12 millimeters.

According to this aspect, the PCB and housing may have a combined thickness between 1.8 and 2.4 millimeters.

According to this aspect, a distance from an external surface of the housing to an interior surface of the MEMS microphone capsule may be between 2.9 and 3.8 millimeters.

According to this aspect, the first and second internal ports may be aligned along an internal port axis and the first and second external ports may be aligned along an external port axis, wherein the external port axis is rotationally offset from the internal port axis.

According to another aspect of the present disclosure, an electronic device is provided, comprising a directional micro-electro-mechanical systems (MEMS) microphone assembly. The directional MEMS microphone assembly may include a MEMS microphone capsule including a first internal port and a second internal port, a printed circuit board (PCB) affixed to the MEMS microphone capsule, a housing affixed to the PCB on a side of the PCB adjacent to the MEMS microphone capsule, and a first external port and a second external port through the housing. The directional MEMS microphone assembly may further include a first cavity and a second cavity, wherein a first acoustical path is formed from the first external port, through the first cavity, to the first internal port, and a second acoustical path is formed form the second external port, through the second cavity, to the second internal port. The directional MEMS microphone assembly may further include a third cavity in the housing sized to accommodate at least a portion of the MEMS microphone capsule that protrudes toward the housing from the PCB, wherein the PCB is affixed to the housing at a location at least partially surrounding a rim or lip of the third cavity.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. An electronic device, comprising:
a directional micro-electro-mechanical systems (MEMS) microphone assembly including:
a MEMS microphone capsule;
a printed circuit board (PCB) affixed to the MEMS microphone capsule;
a housing affixed to the PCB on a side of the PCB opposite the MEMS microphone capsule;
a first internal port and a second internal port through the PCB, wherein the first internal port and second internal port fluidically communicate with the MEMS microphone capsule;
a first external port and a second external port through the housing, wherein the first external port is offset from the first internal port in an offset direction perpendicular to a thickness direction of the directional MEMS microphone; and
a first cavity and a second cavity located between the PCB and the housing, wherein the first cavity fluidically communicates with the first internal port and the first external port, and the second cavity fluidically communicates with the second internal port and the second external port, wherein:
the first and second internal ports are aligned along an internal port axis; and
the first and second external ports are aligned along an external port axis, wherein the external port axis is rotationally offset from the internal port axis.

2. The electronic device of claim 1, wherein the offset direction is a first offset direction, and wherein the second external port is offset from the second internal port in a second offset direction that is perpendicular to the thickness direction.

3. The electronic device of claim 1, further comprising an adhesive gasket layer between the PCB and the housing.

4. The electronic device of claim 1, further comprising an acoustic mesh located along at least a portion of an acoustic wave path from outside the electronic device to the directional MEMS microphone.

5. The electronic device of claim 4, wherein the acoustic mesh is positioned in a location selected from the group consisting of the first external port, the second external port, the first cavity, the second cavity, the first internal port, and the second internal port.

6. The electronic device of claim 1, wherein the first and second external ports are separated by a distance of 10 to 12 millimeters.

7. The electronic device of claim 1, wherein:
each of the first cavity and the second cavity is L-shaped;
the first and second external ports are offset from the first and second internal ports along the housing in respective opposite directions perpendicular to the thickness direction.

8. The electronic device of claim 1, wherein the PCB and housing have a combined thickness between 1.8 and 2.4 millimeters, and a distance from an external surface of the housing to an interior surface of the MEMS microphone capsule is between 2.9 and 3.8 millimeters.

9. The electronic device of claim 1, wherein the first cavity and the second cavity are indentations in the housing.

10. A method for manufacturing an electronic device including a directional micro-electro-mechanical systems (MEMS) microphone assembly, the method comprising:
forming a first external port and a second external port in a housing;
forming a first cavity and a second cavity in the housing, wherein the first cavity fluidically communicates with the first external port and the second cavity fluidically communicates with the second external port;
forming a first internal port and a second internal port in a printed circuit board (PCB);
affixing a MEMS microphone capsule to the PCB such that the first internal port and second internal port fluidically communicate with the MEMS microphone capsule; and
affixing the housing to the PCB such that:
the first internal port fluidically communicates with the first cavity;
the second internal port fluidically communicates with the second cavity;
the first external port is offset from the first internal port in an offset direction perpendicular to a thickness direction of the directional MEMS microphone;
the first and second internal ports are aligned along an internal port axis;
the first and second external ports are aligned along an external port axis; and
the external port axis is rotationally offset from the internal port axis.

11. The method of claim 10, wherein the offset direction is a first offset direction, and wherein the second external port is offset from the second internal port in a second offset direction perpendicular to the thickness direction of the directional MEMS microphone assembly.

12. The method of claim 10, wherein the first external port, second external port, first cavity, and second cavity are formed by routing.

13. The method of claim 10, further comprising applying an adhesive gasket layer to the housing and/or PCB, to thereby join the housing to the PCB.

14. The method of claim 10, further comprising inserting an acoustic mesh into at least a portion of an acoustic wave path between the first and/or second external port and the MEMS microphone capsule.

15. The method of claim 10, wherein the first and second external ports are separated by a distance of 10 to 12 millimeters.

16. The method of claim 10, wherein the PCB and housing have a combined thickness between 1.8 and 2.4 millimeters.

17. The method of claim 10, wherein a distance from an external surface of the housing to an interior surface of the MEMS microphone capsule is between 2.9 and 3.8 millimeters.

18. An electronic device, comprising:
a directional micro-electro-mechanical systems (MEMS) microphone assembly including:
a MEMS microphone capsule including a first internal port and a second internal port;
a printed circuit board (PCB) affixed to the MEMS microphone capsule;
a housing affixed to the PCB on a side of the PCB adjacent to the MEMS microphone capsule;
a first external port and a second external port through the housing;
a first cavity and a second cavity, wherein a first acoustical path is formed from the first external port, through the first cavity, to the first internal port, and a second acoustical path is formed form the second external port, through the second cavity, to the second internal port; and
a third cavity in the housing sized to accommodate at least a portion of the MEMS microphone capsule that protrudes toward the housing from the PCB, wherein the PCB is affixed to the housing at a location at least partially surrounding a rim or lip of the third cavity, wherein:
the first and second internal ports are aligned along an internal port axis; and
the first and second external ports are aligned along an external port axis, wherein the external port axis is rotationally offset from the internal port axis.

* * * * *